(12) United States Patent
Thean et al.

(10) Patent No.: US 7,230,264 B2
(45) Date of Patent: Jun. 12, 2007

(54) SEMICONDUCTOR TRANSISTOR HAVING STRUCTURAL ELEMENTS OF DIFFERING MATERIALS

(75) Inventors: Voon-Yew Thean, Austin, TX (US); Dina H. Triyoso, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/247,866

(22) Filed: Oct. 7, 2005

(65) Prior Publication Data

US 2006/0076579 A1 Apr. 13, 2006

(51) Int. Cl.
*H01L 29/06* (2006.01)
(52) U.S. Cl. .................... 257/19; 257/20; 257/E29.193
(58) Field of Classification Search ............ 257/18–20, 257/417, 418
See application file for complete search history.

(56) References Cited

U.S. PATENT DOCUMENTS

| 6,297,104 | B1 | 10/2001 | Tyagi et al. | |
|---|---|---|---|---|
| 6,596,594 | B1 | 7/2003 | Guo | |
| 6,657,223 | B1 | 12/2003 | Wang et al. | |
| 6,706,614 | B1 | 3/2004 | An et al. | |
| 6,949,482 | B2 * | 9/2005 | Murthy et al. | 438/739 |
| 2003/0116792 | A1 * | 6/2003 | Chen et al. | 257/220 |
| 2004/0099966 | A1 | 5/2004 | Chau et al. | |

FOREIGN PATENT DOCUMENTS

WO    WO 03/012850    2/2003

* cited by examiner

*Primary Examiner*—H. Jey Tsai
(74) *Attorney, Agent, or Firm*—Robert L. King

(57) ABSTRACT

A transistor is formed using a semiconductor substrate and forming a control electrode overlying the semiconductor substrate. A first current electrode is formed within the semiconductor substrate and adjacent the control electrode. The first current electrode has a first predetermined semiconductor material. A second current electrode is formed within the semiconductor substrate and adjacent the control electrode to form a channel within the semiconductor substrate. The second current electrode has a second predetermined semiconductor material that is different from the first predetermined semiconductor material. The first predetermined semiconductor material is chosen to optimize bandgap energy of the first current electrode, and the second predetermined semiconductor material is chosen to optimize strain of the channel.

10 Claims, 9 Drawing Sheets

SEMICONDUCTOR TRANSISTOR HAVING STRUCTURAL ELEMENTS OF DIFFERING MATERIALS

FIELD OF THE INVENTION

This invention relates generally to semiconductors, and more specifically, to semiconductor transistors having very small dimensions.

BACKGROUND OF THE INVENTION

Conventional transistors typically use a same material for the source and drain. The materials that are used are customized for a specific application. For example, for applications where significant power requirements are needed from a transistor, a transistor material having a high breakdown voltage is desirable. Such materials include those materials known to have a high bandgap energy. Currently asymmetric transistors provide advantages that improve transistor device performance. In addition, for transistors that require a high breakdown voltage and low drain junction current leakage a high bandgap material in the drain region is desirable.

Another design parameter for transistors is the consideration of the amount of transistor channel strain. It is desired to have as high a channel strain in a transistor as possible. In order to maximize the channel strain, a high strain material is used in both the source and drain. However, known high strain materials have a low bandgap energy and therefore lower the transistor's breakdown voltage and create higher drain junction current leakage. Thus, the design of transistors involves a tradeoff to maximize two desired properties that cannot be found in a single material.

Others have proposed asymmetric transistor structures with the use of asymmetric dopant implants. The objectives in using asymmetric transistor structures are to minimize the impact of junction capacitance on circuit performance, reduce junction current leakage and gate current leakage.

Transistors that are doped asymmetrically do not address the breakdown and junction leakage that arises from the reduced bandgap energy of the material in the source and drain of the transistor.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
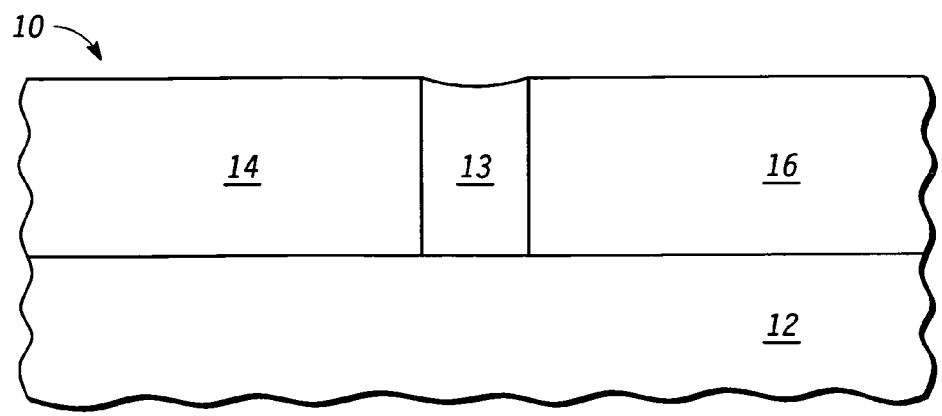
FIGS. 1-8 illustrate in cross-sectional form a semiconductor device having transistors with channels of differing materials.

Illustrated in FIG. 1 is a semiconductor device 10 in accordance with the present invention. A substrate 12 is provided. In one form substrate 12 is a buried oxide material or any semiconductor material. For example, materials such as gallium arsenide, germanium, silicon germanium and other materials may be used as a substrate material. A semiconductor layer, such as silicon, gallium arsenide, germanium, silicon germanium, silicon carbide, etc., is formed overlying substrate 12. The semiconductor layer is separated into a first semiconductor layer region 14 and a second semiconductor layer region 16 by a dielectric isolation region 13. The dielectric isolation region 13 may be any dielectric material and is typically an oxide.

Figure 2:
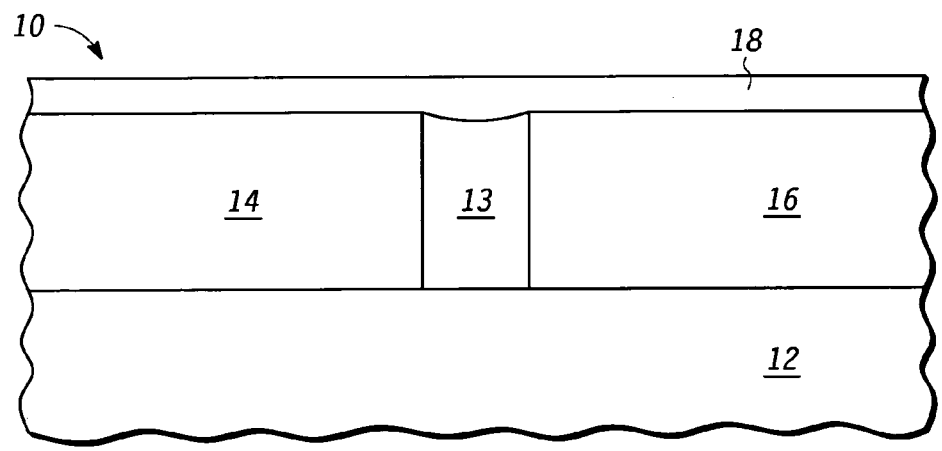

Illustrated in FIG. 2 is semiconductor device 10 having a hafnium oxide layer 18 overlying first semiconductor layer region 14, second semiconductor layer region 16 and dielectric isolation region 13. The hafnium oxide layer 18 is, in one form, provided by using atomic layer deposition (ALD) or metal organic chemical vapor deposition (MOCVD) or physical vapor deposition (PVD). The hafnium oxide layer 18 is an amorphous hafnium oxide layer. It should be understood that hafnium oxide layer 18 may be implemented more generally as any amorphous binary or ternary metal oxide that can be changed to crystalline or polycrystalline (i.e. partially crystalline) form via a thermal process. For exemplary purposes only, the remainder of the discussion will assume that the binary or ternary metal oxide that is used is hafnium oxide.

Figure 3:
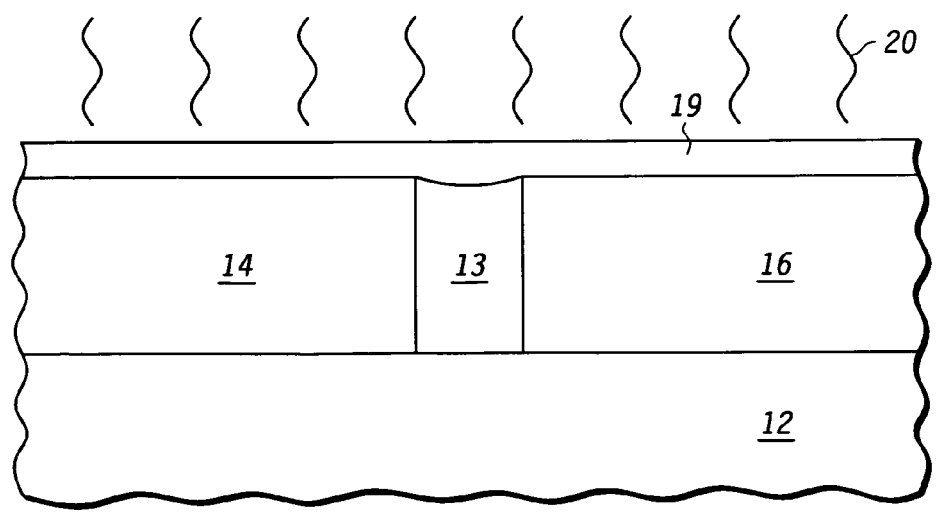

Illustrated in FIG. 3 is semiconductor device 10 being subjected to thermal processing 20. The thermal processing 20 is illustrated by annealing the semiconductor device 10 at high temperature in order to crystallize and densify the hafnium oxide layer 18 to form a polycrystalline hafnium oxide layer 19. Typical annealing temperatures are greater than 500 degrees Celsius for an amount of time determined in part by the thickness of the hafnium oxide layer 18 and the desired density of the hafnium oxide layer 18. It should be noted that in an alternative form the hafnium oxide layer 18 may be deposited onto semiconductor device 10 by directly depositing polycrystalline hafnium oxide.

Figure 4:
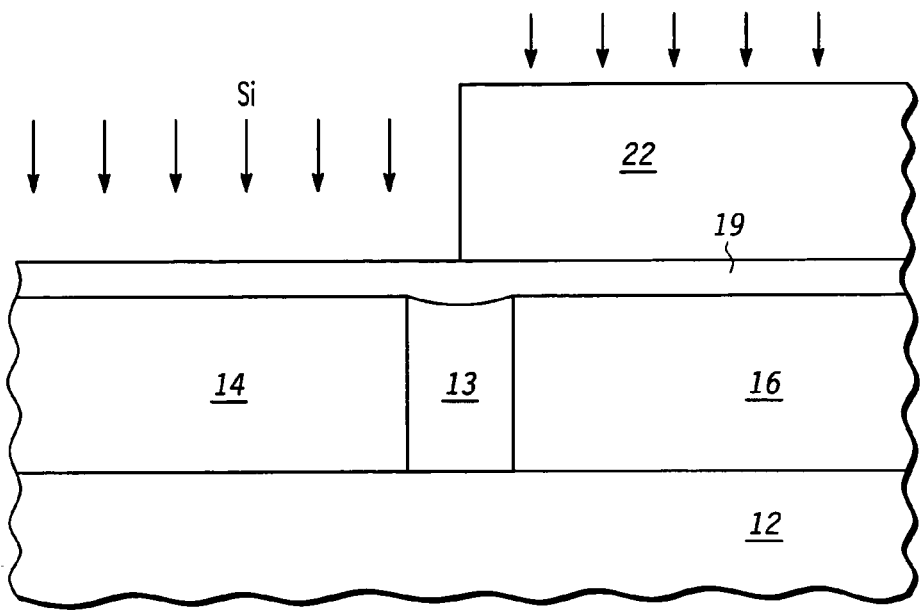

Illustrated in FIG. 4 is semiconductor device 10 wherein a photoresist mask 22 is formed overlying that portion of semiconductor device 10 above the second semiconductor layer region 16 and the dielectric isolation region 13. With the photoresist mask 22 in place, an implant of silicon ions or any heavy ions is implemented. For example, other heavy ions include germanium, xenon or gallium ions. It should be appreciated that rather than depositing silicon, an implant of any heavy ion material that will amorphize the polycrystalline hafnium oxide layer 19 may be used. In another form, a direct implant of silicon rather than ion implantation may be implemented to change the hafnium oxide layer 18 to an amorphous silicate layer.

Figure 5:
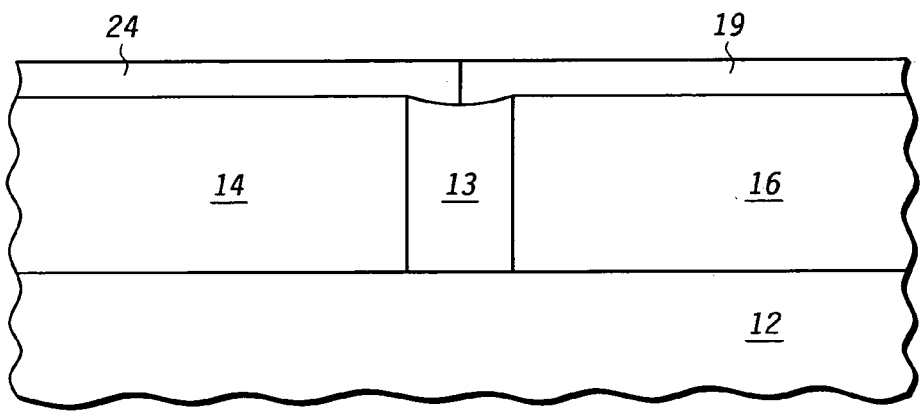

Illustrated in FIG. 5 is semiconductor device 10 upon completion of the implant of FIG. 4. The implant modifies polycrystalline hafnium oxide layer 19 where the silicon ions are implanted. As a result, the polycrystalline hafnium oxide layer 19 becomes an amorphous hafnium oxide layer 24. The amorphous hafnium oxide layer 24 overlies the first semiconductor layer region 14 whereas the polycrystalline hafnium oxide layer 19 overlies the second semiconductor layer region 16. Overlying the dielectric isolation region 13 is an interface between the amorphous hafnium oxide layer 24 and the polycrystalline hafnium oxide layer 19.

Figure 6:
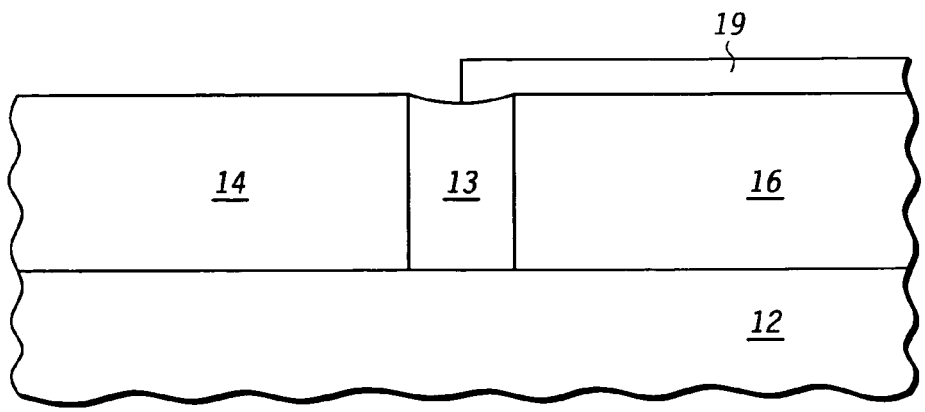

Illustrated in FIG. 6 is semiconductor device 10 wherein the amorphous hafnium oxide layer 24 has been removed. In one form a conventional wet etch process is used to cleanly remove the amorphous hafnium oxide layer 24 without removing any of the underlying first semiconductor layer region 14 or the polycrystalline hafnium oxide layer 19. The wet etch is very selective to hafnium. In one form dilute hydrofluoric acid, HF, may be used to remove the amorphous hafnium oxide layer 24.

Figure 7:
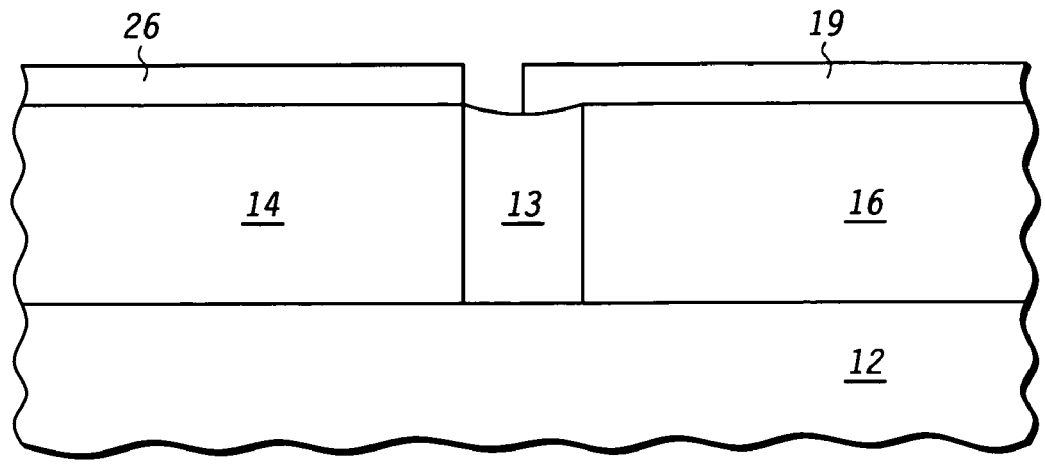

Illustrated in FIG. 7 is semiconductor device 10 wherein a semiconductor layer 26 is formed overlying the first semiconductor layer region 14. In one form the semiconductor layer 26 is epitaxially grown on only exposed semiconductor material. Therefore, none of semiconductor layer 26 is formed overlying the dielectric isolation region 13. In one form the first semiconductor layer region 14 is formed of silicon germanium. It should be apparent that other semiconductor materials as well as any of numerous dielectric materials may be expitaxially grown on the first semiconductor layer region 14. The growth of the semiconductor layer 26 is stopped at a predetermined height. In one form the height of semiconductor layer 26 is made to be comparable with the height of the polycrystalline hafnium oxide layer 19 but any other height may be created. Semiconductor layer 26 may be implemented with any of a number of semiconductor materials, such as silicon, germanium, silicon germanium, silicon carbide, carbon-doped silicon and any in-situ doped form of the above materials. Semiconductor layer 26 is selected to be of different material than first semiconductor layer region 14. For example, if semiconductor layer region 14 is silicon, semiconductor layer 26 may be selected to be silicon germanium, silicon carbide, germanium or some other semiconductor material. Therefore, it should be appreciated that at this point in the processing there has been formed a semiconductor device having two electrically isolated areas that have two distinctly different exposed semiconductor materials from which to form additional devices.

Figure 8:
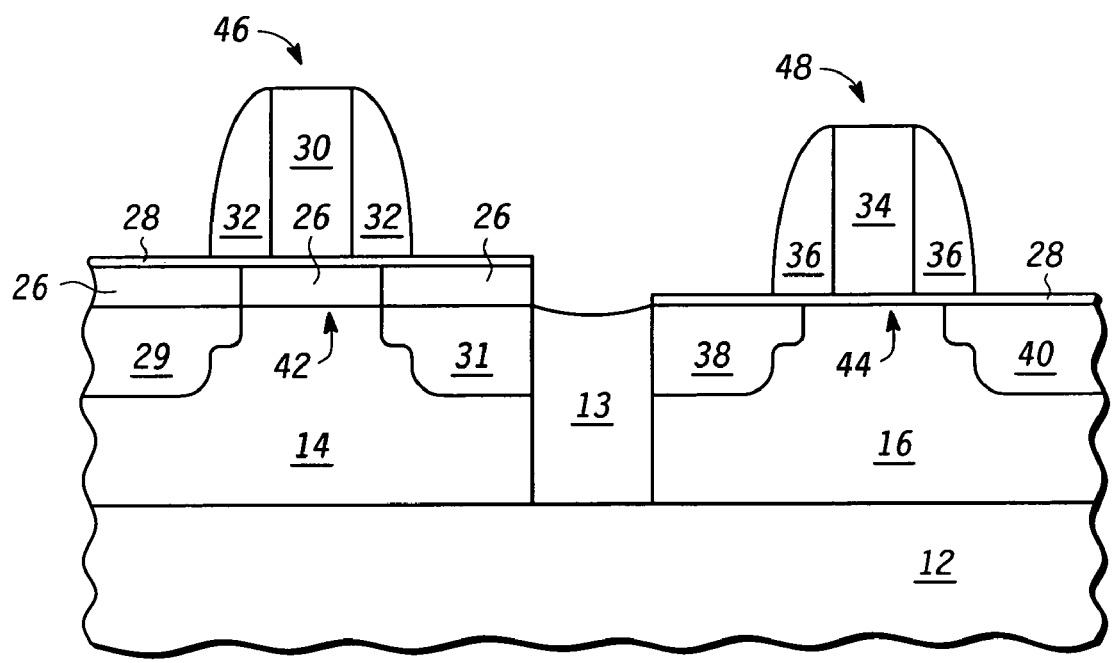

Illustrated in FIG. 8 is one form of semiconductor device 10 which uses the structure of FIG. 7. Further below another use of the semiconductor device 10 will be disclosed in connection with FIGS. 9-19. In FIG. 8 there is illustrated a first transistor 46 and a second transistor 48 formed from semiconductor device 10 of FIG. 7. Initially, the polycrystalline hafnium oxide layer 19 is removed by using a thermal treatment that removes the hafnium oxide chemically. An example of this thermal treatment is a process using a combination of gaseous HCl and heat. Such thermal process is taught in WO 03/012850 A1 by Hobbs et al. The polycrystalline hafnium oxide layer 19 is still in a polycrsytalline phase. Subsequently, a thin gate oxide layer 28 is formed on the semiconductor layer 26 and the second semiconductor layer region 16. A conventional transistor having a gate and a spacer is formed within each of the first semiconductor layer region 14 and the second semiconductor layer region 16. In particular, the first transistor 46 is formed with a channel having the material of silicon germanium and the second transistor 48 is formed with a channel having the material of silicon. Therefore, in a single process there have been formed transistors having structural elements of differing materials. Transistor 46 has a conventional sidewall spacer 32 and a source 29 and a drain 31. Transistor 48 has a conventional sidewall spacer 36 and a source 38 and a drain 40.

The channel 42 contains enhanced conductivity for certain carrier types which is different than the conductivity of channel 44. The strain can therefore be optimized differently for transistors in the first semiconductor layer region 14 versus the second semiconductor layer region 16. Thus transistor 46 may be formed with a channel material having a different bandgap material than transistor 48 which are in close proximity but separated by an isolation region. For example, the variation in channel materials may permit one transistor to be designed for a power application while the other transistor is used for a logic application. The use of hafnium oxide as a mask in the method detailed herein is an efficient process to implement transistors on a same substrate having differing bandgap material channels. In the disclosed process, no plasma-based etch, as opposed to a less abrasive chemical removal treatment, is used.

Figure 9:
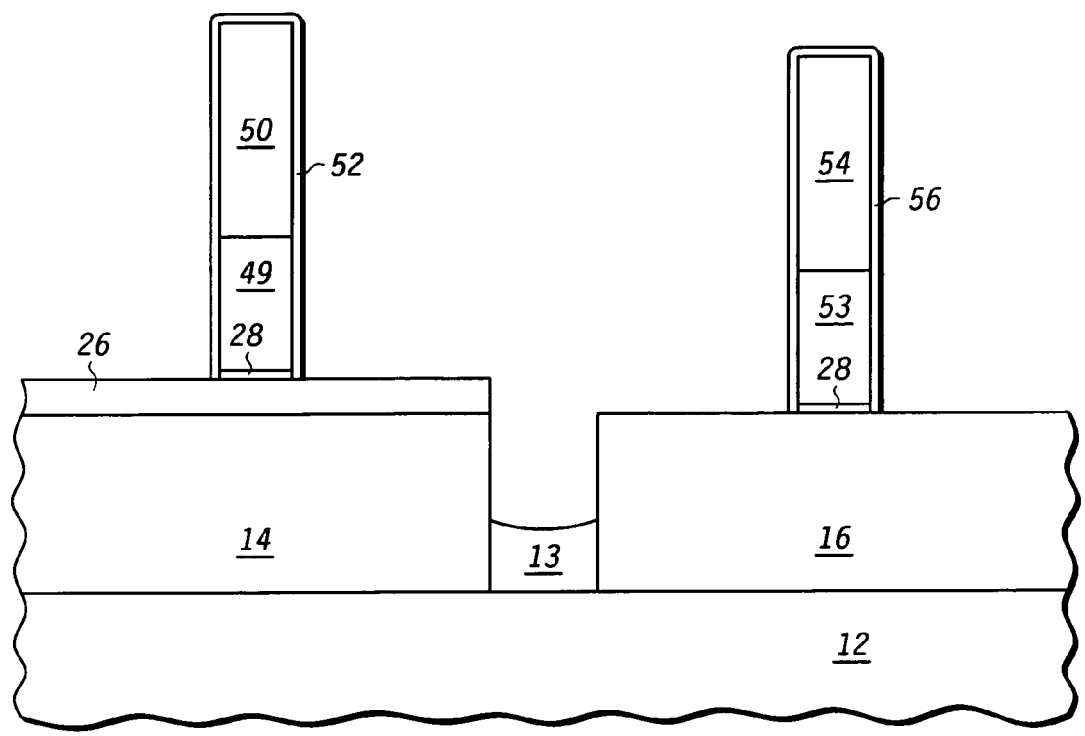
FIGS. 9-19 illustrate in cross-sectional form a semiconductor device having transistors with asymmetric current electrodes.

Illustrated in FIG. 9 is an alternative use of the semiconductor device 10 of FIG. 7. For convenience of illustration elements in FIGS. 9-19 that are analogous to elements in FIGS. 1-8 are given the same element number.

It should be noted that dielectric isolation region 13 is sized to have an appropriate depth based upon the desired application. Therefore, in the embodiment described herein the dielectric isolation region 13 is reduced in depth from that previously illustrated by using a conventional wet etch after removal of the polycrystalline hafnium oxide layer 19. The polycrystalline hafnium oxide layer 19 is removed as described above in connection with FIG. 8. Gates 49 and 53 are, in one form, polysilicon and are formed on a thin gate oxide layer 28 by conventional deposition and etching of polysilicon. In another form, gate 49 and gate 53 are formed of metal and in another form gate 49 and gate 53 are formed of a stack of metal and polysilicon layers. It should be appreciated that the semiconductor device 10 is not necessarily drawn to scale and thus the heights and widths of the gates may vary significantly. Above each of gate 49 and gate 53 is respectively formed an insulator 50 and an insulator 54. Insulator 50 and insulator 54 are deposited in one embodiment, but may be epitaxially grown depending upon the material composition of gate 49 and gate 53. The height of insulator 50 and insulator 54 is selected to make the gate stack have a predetermined height as discussed below. In another form, insulator 50 and insulator 54 are not used and the gate structure includes only gate 49 and gate 53. A thin spacer 52 surrounds and encapsulates the gate 49, insulator 50 and thin gate oxide layer 28. Similarly, a thin spacer 56 surrounds and encapsulates the gate 53, insulator 54 and thin gate oxide layer 28. In one form, thin spacer 52 and thin spacer 56 are nitride spacers.

Figure 10:
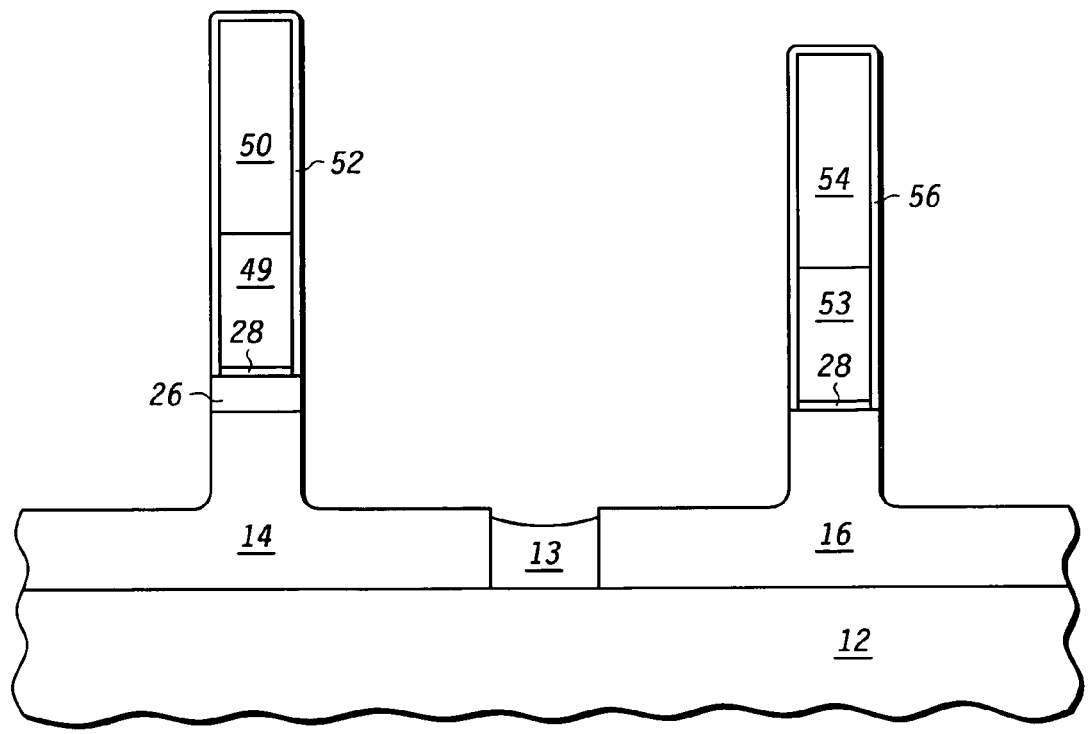

Illustrated in FIG. 10 is further processing of semiconductor device 10 wherein a silicon recessed etch is performed to generate a reduced amount of semiconductor layer region 14 laterally adjacent gate 49 and a reduced amount of the second semiconductor layer region 16 laterally adjacent gate 53. Therefore, semiconductor layer 26 is reduced in size and only exists immediately underneath gate 49 and the thin gate oxide layer 28. Because semiconductor layer 26 is present in the gate stack associated with gate 49 but is not present in the gate stack associated with gate 53, the gate stack having gate 49 is taller. It should be noted that the removal of a significant amount of the first semiconductor layer region 14 and the second semiconductor layer region 16 results in the removal of what would typically be the source and drain regions for each of gates 49 and 53, respectively. This formation permits the subsequent formation of a recessed source and drain for each of gates 49 and 53.

Figure 11:
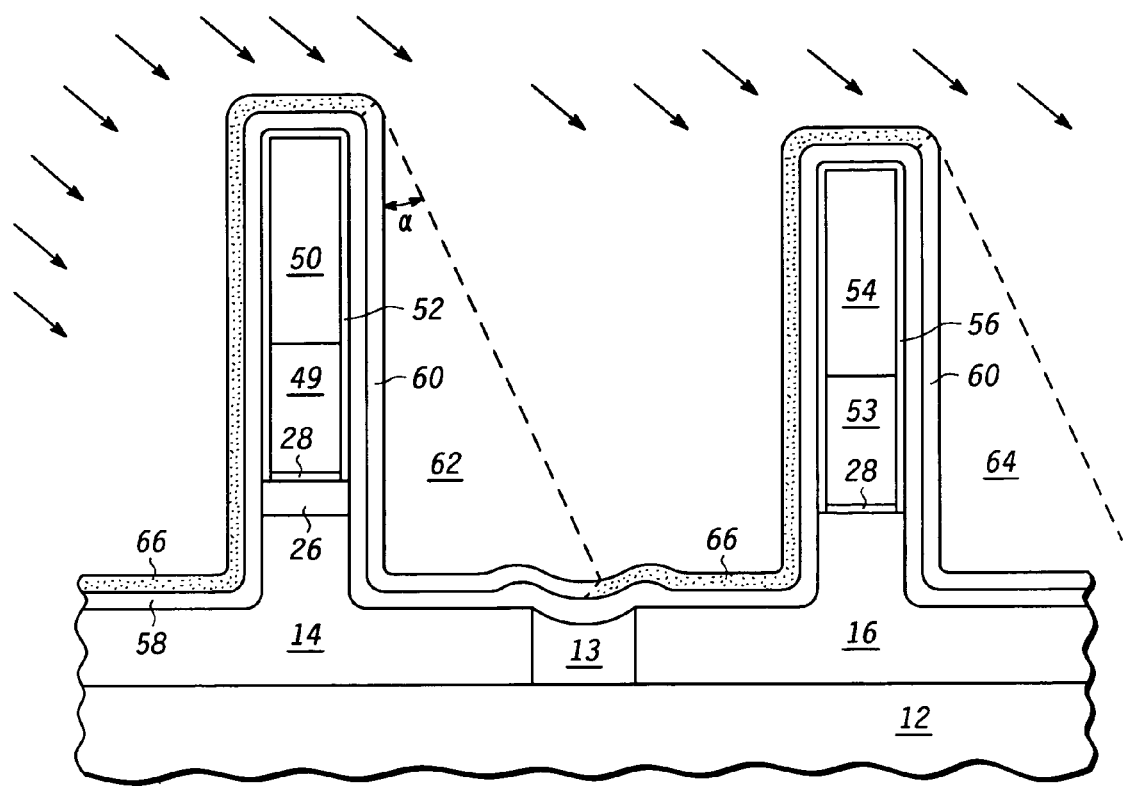

Illustrated in FIG. 11 is further processing of semiconductor device 10 wherein a silicon or heavy ion angled shallow implant is performed to implement making a dielectric layer amorphous by using the heavy ion implant. Other exemplary ions in addition to silicon include gallium, germanium, silicon, xenon or others. The implant is a relatively low energy implant for the purpose of avoiding damage to underlying layers of semiconductor device 10. For example, an implant energy of no greater than 10 Kev is desirable and an implant energy in the range of 3-5 Kev or less is preferred. First, a deposition of a conformal protective dielectric layer 58 is performed. This deposition is an optional process step and in one form the material TEOS is used as the dielectric. When conformal protective dielectric layer 58 is used, a conformal hafnium oxide layer 60 is deposited overlying conformal protective dielectric layer 58. As with the prior embodiment, the hafnium oxide layer 60 may be implemented more generally with any binary or ternary metal oxide layer that may be crystallized or polycrystallized (i.e. partially crystallized) via a thermal process. An optional thermal treatment to densify and to crystallize hafnium oxide may be performed if hafnium oxide is not crystalline as deposited. Once conformal protective dielectric layer 58 and conformal hafnium oxide layer 60 are formed, the heavy ion angled implant is performed. In the illustrated form the angled implant is from the left to the right. It should be appreciated that the angled implant direction could be reversed. Assume that a silicon angled implant is implemented. However, other implant species, such as germanium, may be used. The exposed areas of conformal hafnium oxide layer 60 become amorphized and an amorphous hafnium oxide layer 66 is formed. The use of an angled implant forms a shadow region 62 and a shadow region 64 in which no implant ions strike the hafnium oxide. In those areas, the hafnium oxide is not amorphized and remains the conformal hafnium oxide layer 60 in polycrystalline form.

It should be understood that the shadow region 62 and shadow region 64 may be adjusted by several techniques. For example, the angle of the implant may be adjusted to vary the amount of area within each of shadow region 62 and shadow region 64. Additionally, the height of gate 49 and gate 53 or gate 49/insulator 50 and gate 53/insulator 54 may be made greater (i.e. taller) to increase the length of shadow region 62 and shadow region 64, respectively. Because tall gate structures are not necessarily desirable for some processes, the gate 49 and gate 53 may be made smaller than indicated and the insulator 50 and insulator 54 made taller than indicated. In another embodiment the insulator 50 and insulator 54 may not be used and gate 49 and gate 53 are initially formed much higher than desired and later reduced in height after angle implantation is completed. It should be noted also that in another form different transistors on an integrated circuit may be formed with differing gate stack heights. For example, insulator 50 may have a different height than insulator 54 to create differing shadow region lengths. Alternatively, when insulator 50 and insulator 54 are not used, gate 49 may be formed with a height that is different from that of gate 53.

Figure 12:
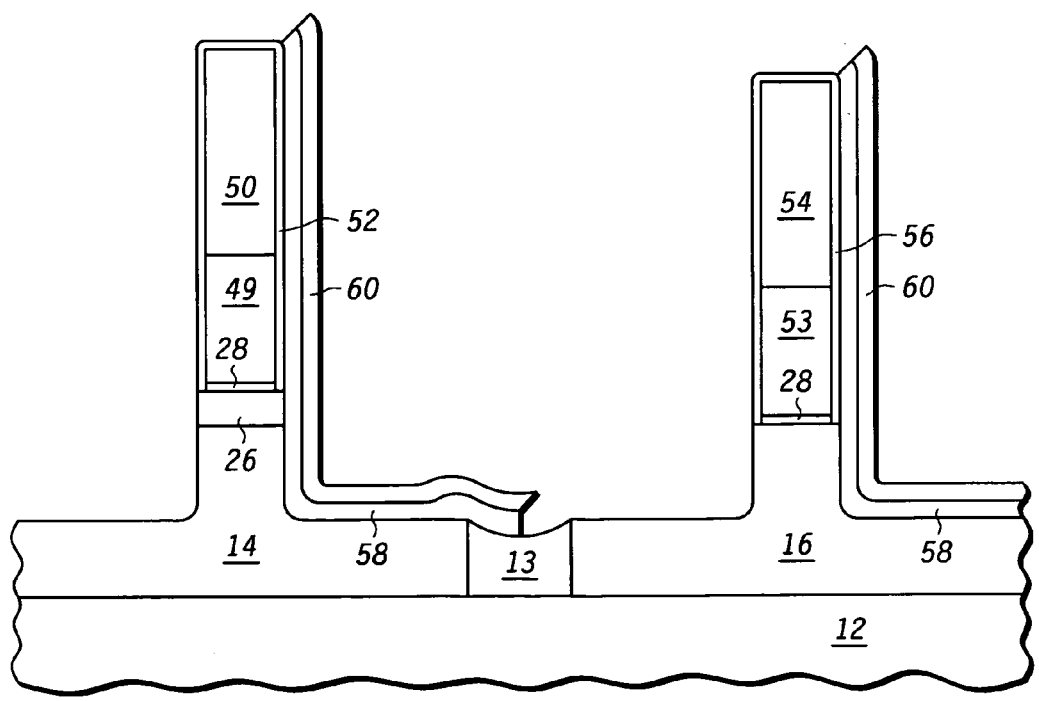

Illustrated in FIG. 12 is further processing of semiconductor device 10 wherein the amorphous hafnium oxide layer 66 and the underlying conformal protective dielectric layer 58, if present, is removed by a conventional HF based wet etch. The wet etch is very selective to amorphous hafnium oxide and TEOS which in one form is the material used for the conformal protective dielectric layer 58. As a result of the angled implant, the remaining portion of the conformal hafnium oxide layer 60 is along only one side of each of gate 49 and gate 53 and continues laterally a short distance from only one side of these gates.

Figure 13:
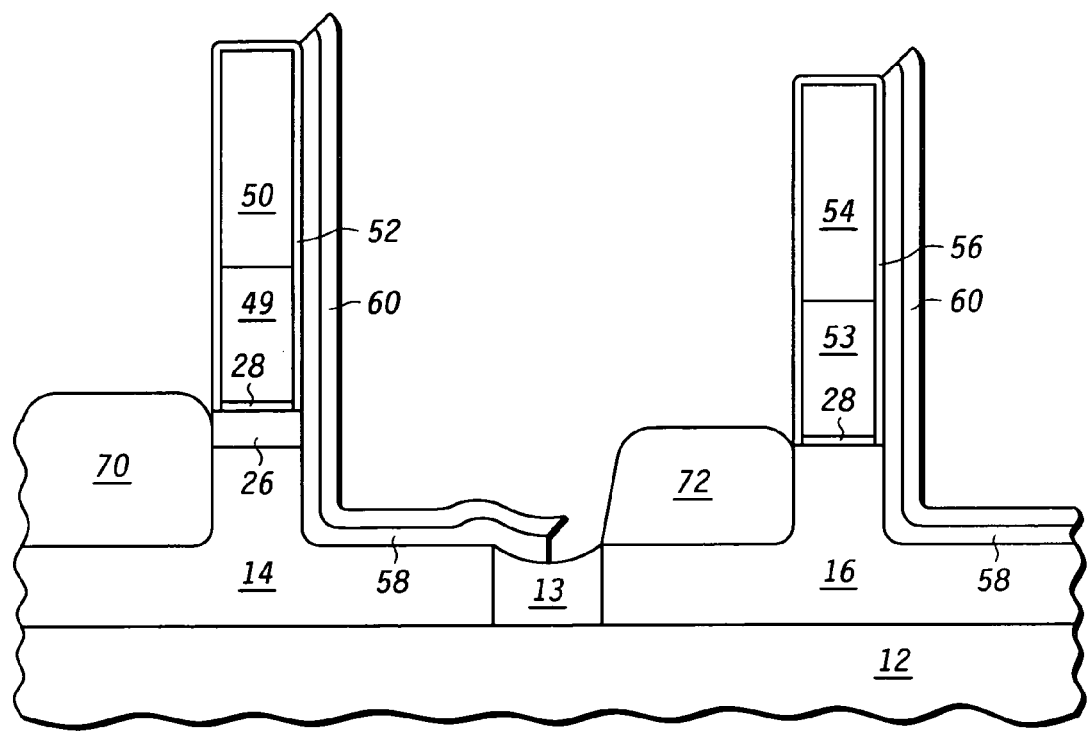

Illustrated in FIG. 13 is further processing of semiconductor device 10 wherein a semiconductor region 70 and a semiconductor region 72 are selectively epitaxially grown on the exposed portions of the first semiconductor layer region 14 and the second semiconductor layer region 16.

Suitable materials for semiconductor region 70 and semiconductor region 72 are silicon germanium (SiGe), germanium (Ge), silicon carbide (SiC), silicon (Si) and other semiconductor materials. These materials may be either in-situ doped or subsequently doped. The semiconductor region 70 and semiconductor region 72 will function as either a source or a drain to the respective adjacent gate. If used as a source, the semiconductor region 70 and semiconductor region 72 will function as a channel stressor. If used as a drain, the semiconductor region 70 and semiconductor region 72 will be selected to be a high bandgap energy material (carbon doped silicon or silicon carbide or silicon).

Figure 14:
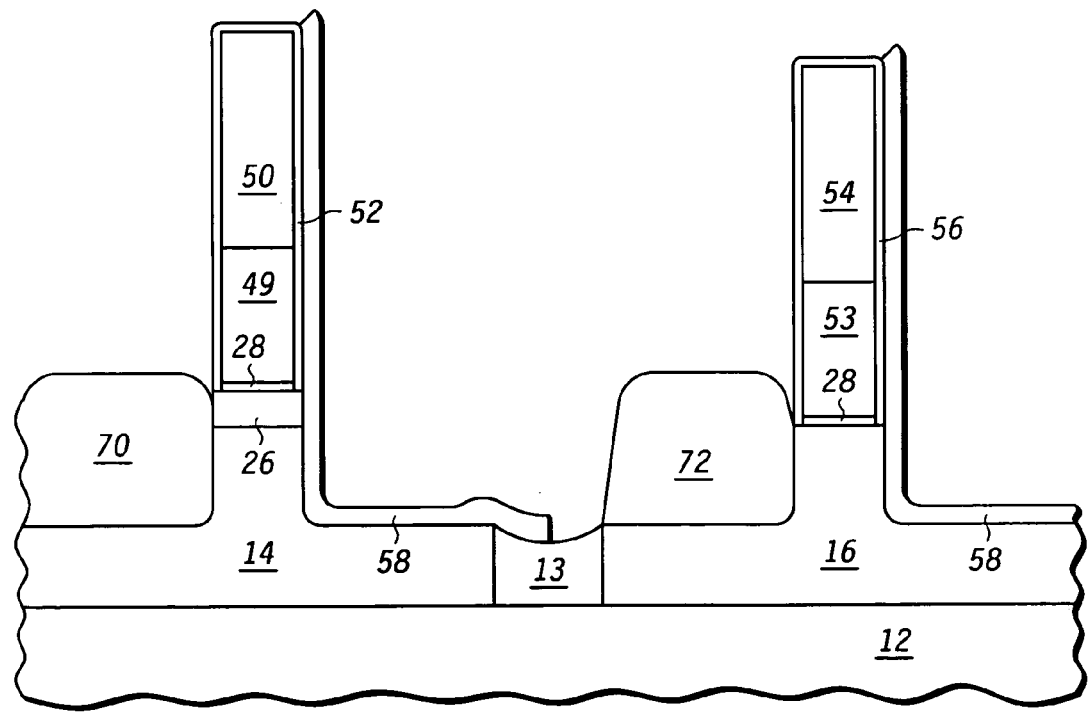

Illustrated in FIG. 14 is further processing of semiconductor device 10 wherein the conformal hafnium oxide layer 60 is removed by using a thermal treatment that removes the hafnium oxide chemically. An example of this thermal treatment is a process using a combination of gaseous HCl and heat. As previously stated, such thermal process is taught in WO 03/012850 A1 by Hobbs et al.

Figure 15:
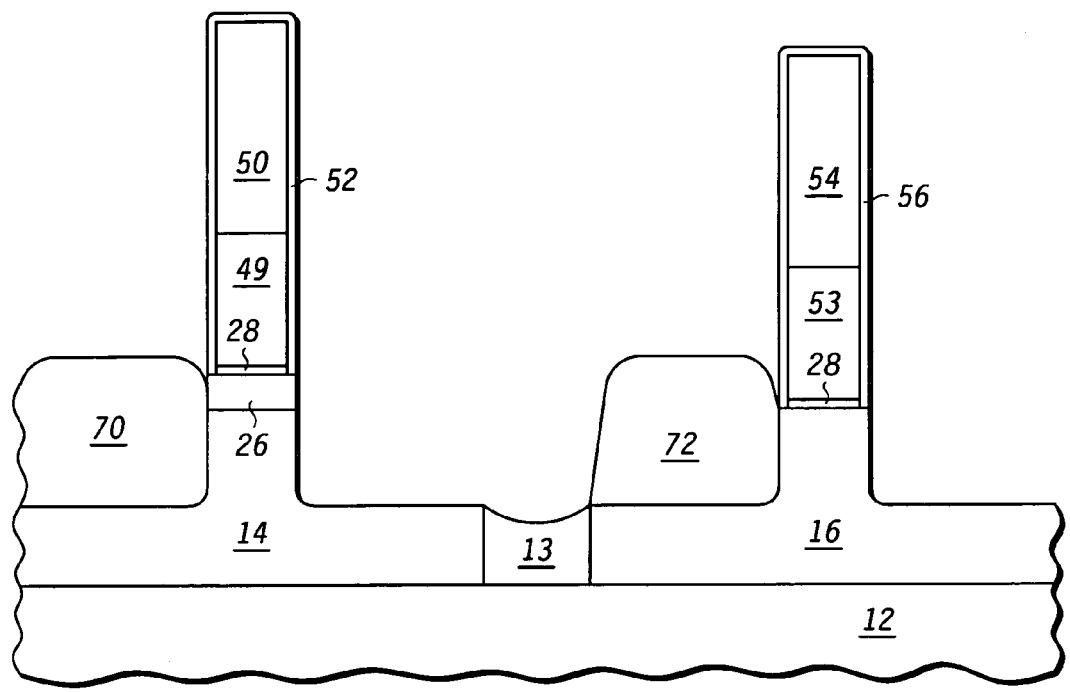

Illustrated in FIG. 15 is further processing of semiconductor device 10 wherein the conformal protective dielectric layer 58 is selectively removed using a conventional wet etch. As a result of this etch and the removal of the conformal hafnium oxide layer 60, the first semiconductor layer region 14 and the second semiconductor layer region 16 are exposed to the right of gate 49 and gate 53, respectively. These exposed regions permit an area for subsequent formation of a second recessed current electrode.

Figure 16:
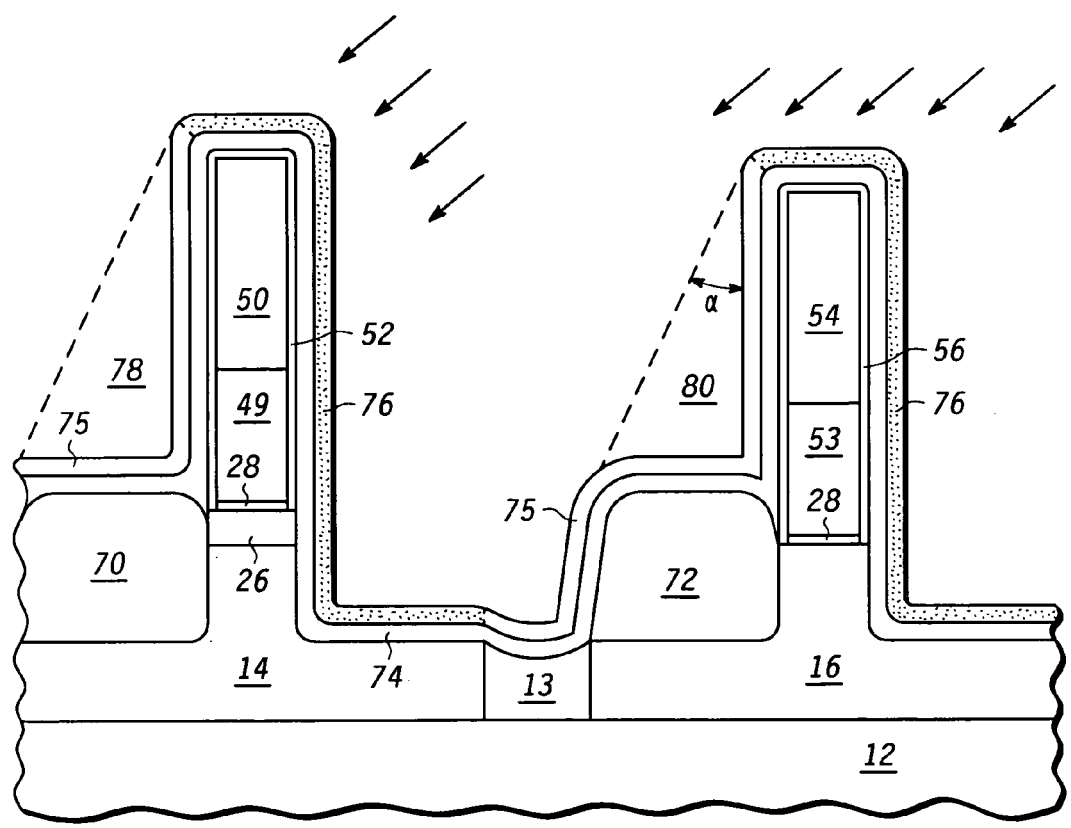

Illustrated in FIG. 16 is further processing of semiconductor device 10 wherein a second silicon or heavy ion angled implant is performed. First, a deposition of a conformal protective dielectric layer 74 is performed. This deposition is an optional process step and in one form the material TEOS is used as the dielectric. When the conformal protective dielectric layer 74 is used, a conformal hafnium oxide layer 75 is deposited overlying the conformal protective dielectric layer 74. The hafnium oxide layer 75 is an amorphous hafnium oxide layer. It should be understood that hafnium oxide layer 75 may be implemented more generally as any amorphous binary or ternary metal oxide that can be changed to crystalline or polycrystalline (i.e. partially crystalline) form via a thermal process. For exemplary purposes only, the remainder of the discussion will assume that the binary or ternary metal oxide that is used is hafnium oxide. An optional thermal treatment to densify and to crystallize hafnium oxide may be performed if hafnium oxide is not crystalline as deposited. Once conformal protective dielectric layer 74 and conformal hafnium oxide layer 75 are formed, the heavy ion angled implant is performed. In the illustrated form the angled implant is from right to left. Assume that a silicon angled implant is implemented. The exposed areas of conformal hafnium oxide layer 75 become amorphized and form an amorphous hafnium oxide layer 76. The use of an angled implant forms a shadow region 78 and a shadow region 80 in which no implant ions strike the hafnium oxide. In those areas, the hafnium oxide is not amorphized and remains the conformal hafnium oxide layer 75 in polycrystalline form.

Figure 17:
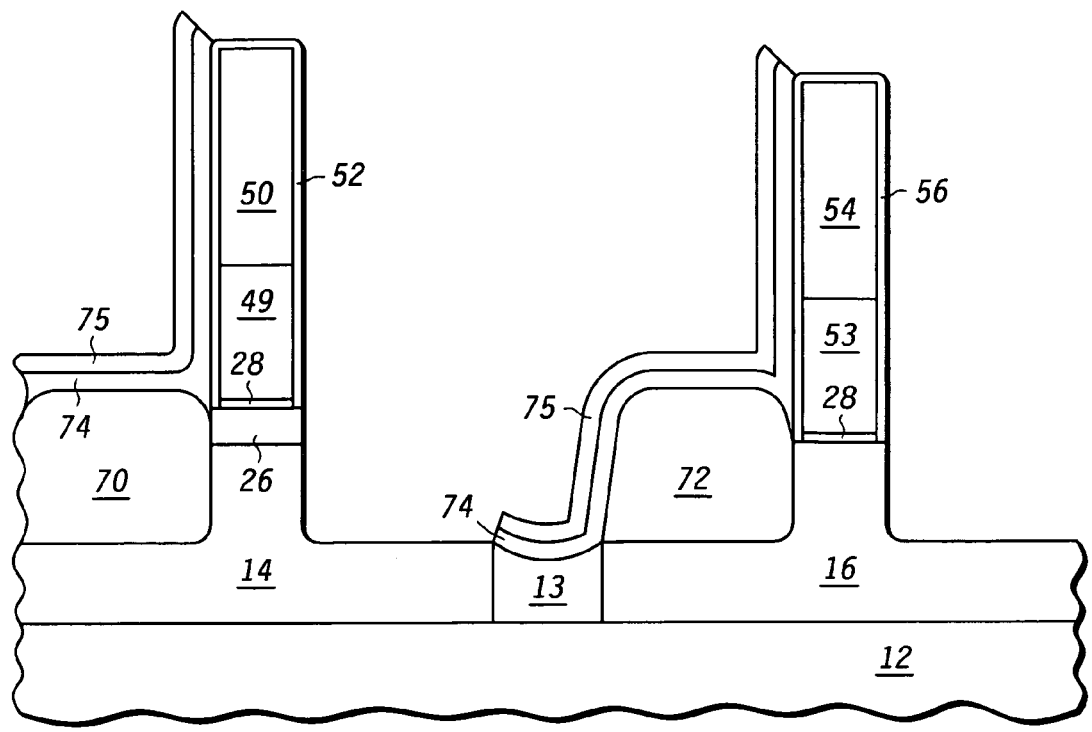

Illustrated in FIG. 17 is further processing of semiconductor device 10 wherein the amorphous hafnium oxide layer 76 and the underlying the conformal protective dielectric layer 74, if present, is removed by a conventional HF based wet etch. The wet etch is very selective to amorphous hafnium oxide and TEOS. As a result of the angled implant, the remaining portion of the conformal hafnium oxide layer 75 is along only one side of each of gate 49 and gate 53 and a short distance lateral only one side of these gates.

Figure 18:
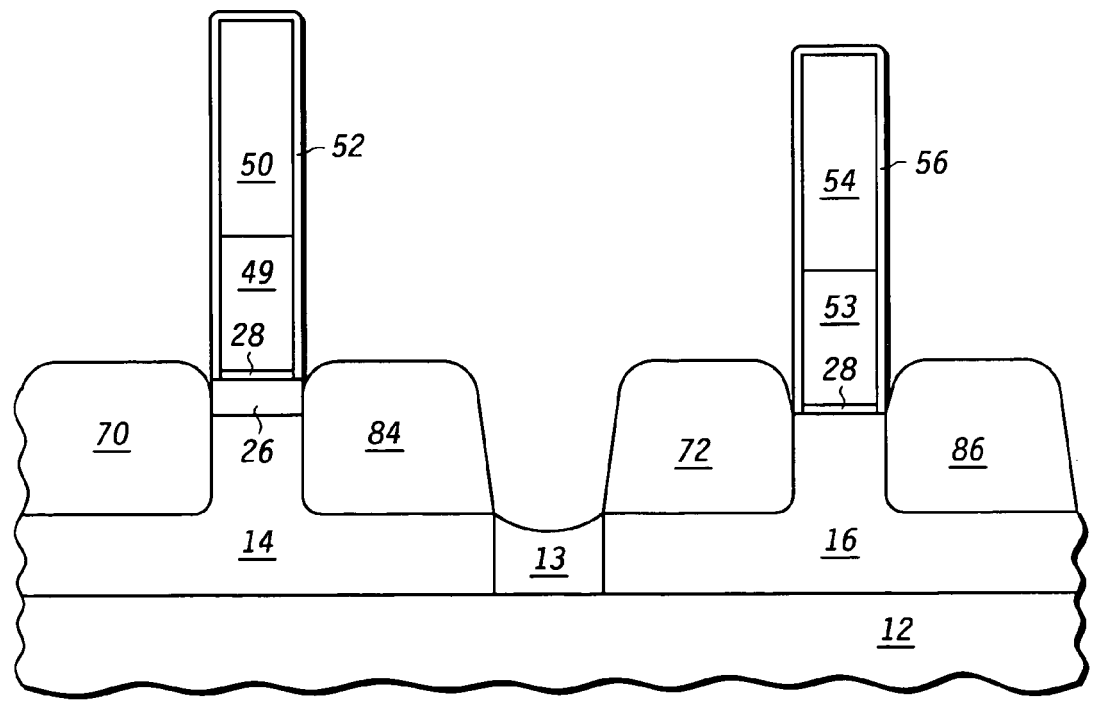

Illustrated in FIG. 18 is further processing of semiconductor device 10 wherein a semiconductor region 84 and a semiconductor region 86 are selectively epitaxially grown on the exposed portions of the first semiconductor layer region 14 and the second semiconductor layer region 16, respectively. Suitable materials for semiconductor region 84 and semiconductor region 86 are silicon germanium, germanium, silicon carbide, silicon and other semiconductor materials. Regardless of which material is selected, semiconductor region 84 and semiconductor region 86 are of different materials than semiconductor region 70 and semiconductor region 72. These materials may be either in-situ doped or subsequently doped. The semiconductor region 84 and semiconductor region 86 will function as either a source or a drain to the respective adjacent gate. If used as a source, the semiconductor region 84 and semiconductor region 86 will function as a channel stressor. If used as a drain, the semiconductor region 84 and semiconductor region 86 will be selected to be a high bandgap energy material (carbon doped silicon or silicon carbide or silicon). At this point the conformal hafnium oxide layer 75 is removed by using a thermal treatment that removes the hafnium oxide chemically. An example of this thermal treatment is a process using a combination of gaseous HCl and heat. As previously stated, such thermal process is taught in WO 03/012850 A1 by Hobbs et al. After the conformal hafnium oxide layer 75 is removed, the conformal protective dielectric layer 74 is removed by a conventional wet etch to form the structure illustrated in FIG. 18. It should be understood that further conventional processing of semiconductor device 10 such as a halo implantation or source/drain adjustment implants may be implemented to further adjust the performance parameters of semiconductor device 10.

Figure 19:
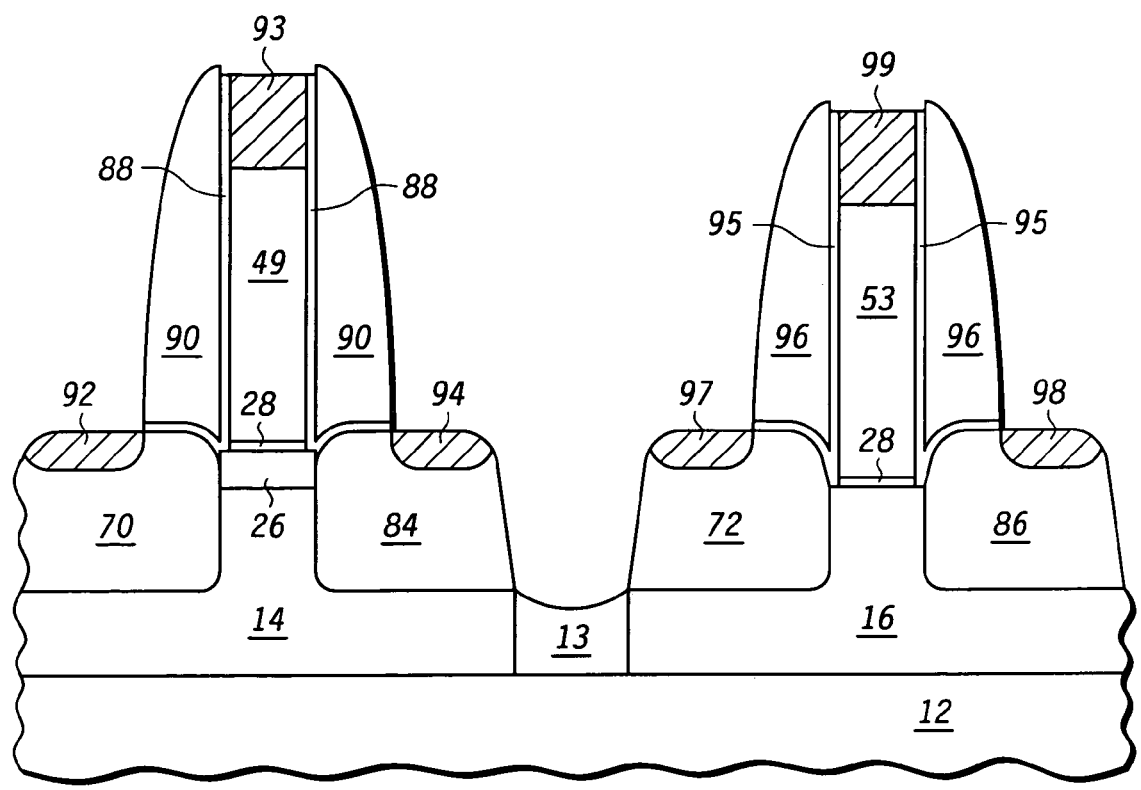

Illustrated in FIG. 19 is further processing of semiconductor device 10 to illustrate formation of functional transistors around gate 49 and gate 53. Thin spacer 52 becomes a sidewall oxide spacer 88 that extends around gate 49 and above a portion of semiconductor region 70 and semiconductor region 84 laterally adjacent to gate 49. A top portion of thin spacer 52 is removed from above gate 49 (and insulator 50) by a dry etch process prior to or during the formation of a silicide offset spacer 90. Insulator 50 is also removed. Formed within semiconductor region 70 is silicide region 92 and formed within semiconductor region 84 is silicide region 94. Electrical contact to the gate 49 is made by a silicide region 93. It should be noted that if gate 49 is formed of metal the silicide region 93 is not required and the sidewall oxide spacer 88 and silicide offset spacer 90 terminate substantially at the top of the sidewall of gate 49.

Similarly, thin spacer 56 becomes a sidewall oxide spacer 95 extending around gate 53 and above a portion of semiconductor region 72 and semiconductor region 86 laterally adjacent to gate 53. A top portion of thin spacer 56 is removed from above gate 53 (and insulator 54) by a dry etch process prior to or during the formation of a silicide offset spacer 96. Insulator 54 is also removed. Formed within semiconductor region 72 is silicide region 97 and formed within semiconductor region 86 is silicide region 98. Electrical contact to the gate 53 is made by a silicide region 99. It should be noted that if gate 53 is formed of metal the silicide region 99 is also not required and the sidewall oxide spacer 95 and silicide offset spacer 96 terminate substantially at the top of the sidewall of gate 53. Use of silicide offset spacer 90 and silicide offset spacer 96 is optional.

By now it should be appreciated that there has been provided a semiconductor method and transistor structure having asymmetrical source and drain electrode materials and transistors having asymmetrical channel materials. The source, drain and channel materials can be optimized for specific power and performance needs and optimized for strain. Because the ideal transistor structure is a high bandgap material for the drain and a strain material that is low bandgap for the source, the disclosed transistor structure and method may be used to implement the optimum different materials in a same transistor.

In the foregoing specification, the invention has been described with reference to specific embodiments. However, one of ordinary skill in the art appreciates that various modifications and changes can be made without departing from the scope of the present invention as set forth in the claims below. For example, a transistor structure and method may be used in which there is no recessing of the source and drain electrodes, such as in ultra-thin body transistors such as a planar fully depleted SOI transistor or a vertical multiple gate device. In other words, a transistor may be implemented wherein the source and drain are elevated with the use of asymmetric materials (i.e. the drain and source are both lateral and below the gate). The structure taught herein is applicable to all transistors having gate sidewall spacers. Also, various types of transistors such as bipolar, nanocrystal, GaAs and others may be implemented. Any integration that requires structures built on a source or drain will be enhanced by use of the asymmetrical structure. Amorphous binary or ternary metal oxides other than $HfO_2$ that can be crystallized or partially crystallized through a thermal process and can be amorphized and subsequently removed by chemical treatment may be used. Accordingly, the specification and figures are to be regarded in an illustrative rather than a restrictive sense, and all such modifications are intended to be included within the scope of the present invention.

In one form there is provided herein a method for forming a transistor semiconductor device. A semiconductor substrate is provided. A control electrode overlying the semiconductor substrate is formed. A first current electrode within the semiconductor substrate and adjacent the control electrode is formed, the first current electrode having a first predetermined semiconductor material. A second current electrode within the semiconductor substrate and adjacent the control electrode is provided to form a channel within the semiconductor substrate, the second current electrode having a second predetermined semiconductor material that is different from the first predetermined semiconductor material. The first predetermined semiconductor material is chosen to optimize bandgap energy of the first current electrode, and the second predetermined semiconductor material is chosen to optimize strain of the channel. In one exemplary form the first predetermined semiconductor material is selected to be silicon carbide and the second predetermined semiconductor material is selected to be silicon germanium. The first current electrode and the second current electrode are formed by forming the control electrode overlying a semiconductor region overlying the substrate. A first conformal layer of hafnium oxide is formed around and laterally adjacent the control electrode. A first angled implant of ions is performed from a first side direction to the control electrode and the first conformal layer of hafnium oxide is amorphized along a first side of the control electrode and above the control electrode. The first conformal layer of hafnium oxide that has been amorphized along the first side of the control electrode, above the control electrode and laterally adjacent the first side of the control electrode is removed. The first current electrode is formed by epitaxial growth from a first exposed portion of the semiconductor region. The first conformal layer of hafnium oxide is removed along a second side of the control electrode opposite the first side thereof and laterally adjacent the second side of the control electrode. A second conformal layer of hafnium oxide is formed around and laterally adjacent the control electrode and over the first current electrode. A second angled implant of ions is performed from a second side direction to the control electrode opposite the first side direction and the first conformal layer of hafnium oxide along a second side of the control electrode and above the control electrode is amorphized. The second conformal layer of hafnium oxide that has been amorphized along the second side of the control electrode, above the control electrode and laterally adjacent the second side of the control electrode is removed. The second current electrode is formed by epitaxial growth from the semiconductor region. The second current electrode is formed by epitaxial growth from a second exposed portion of the semiconductor region. In another form the control electrode is vertically extended by forming an insulating material over the control electrode, the extending enlarging a predetermined shadow region adjacent the control electrode during the first angled implant and the second angled implant. In another form a second semiconductor device having a control electrode, a first current electrode and a second current electrode is formed, the second semiconductor device being separated from the first semiconductor device by an isolation region and having a channel of material composition that is different from a channel material composition of the first device. In another form the isolation region is used to form a first semiconductor region and a second semiconductor region. Prior to forming the control electrode of the first semiconductor device and the second semiconductor device, an initial conformal layer of hafnium oxide is formed over the first semiconductor region, the isolation region and the second semiconductor region. The initial conformal layer of hafnium oxide over the first semiconductor region is amorphized and removed. A predetermined channel material is formed on an exposed portion of the first semiconductor region while not forming the predetermined channel material on the second semiconductor region. The initial conformal layer of hafnium oxide is removed from the second semiconductor region.

In another form there is provided a transistor having a semiconductor substrate. A control electrode overlies the semiconductor substrate. A first current electrode overlies the semiconductor substrate and is adjacent a portion of a first side of the control electrode. The first current electrode is a first predetermined semiconductor material. A second current electrode overlies the semiconductor substrate and is adjacent a portion of a second side of the control electrode, the first current electrode and the second current electrode forming a channel underlying the control electrode. The second current electrode has a second predetermined semiconductor material that is different from the first predetermined semiconductor material. The first predetermined semiconductor material is chosen to optimize bandgap energy of the first current electrode, and the second predetermined semiconductor material is chosen to optimize strain of the channel. A second transistor is laterally adjacent the transistor and separated by an isolation material, the second transistor being a transistor having a channel, the second channel of the second semiconductor device having a channel material composition that differs from that of the channel of the first semiconductor device. The second transistor includes a gate and first and second current electrodes which respectively have a same material composition as the gate, first current electrode and second current electrode of the transistor. In one form the first predetermined semiconductor material is silicon germanium and the second predetermined semiconductor material is silicon carbide. In another form a semiconductor layer overlies the substrate and is between the substrate and each of the first current electrode and the second current electrode, the semiconductor layer having a greater height immediately below the control electrode than adjacent the control electrode. In another form there is an offset spacer laterally surrounding the control electrode.

In yet another form there is a method of forming transistors by providing a semiconductor base layer. A dielectric layer is formed overlying the semiconductor base layer. A portion of the dielectric layer is amorphized by subjecting the dielectric layer to a heavy ion implant. The portion of the dielectric layer that is amorphous is removed and a non-amorphous remainder of the dielectric layer is left. A semiconductor layer overlying the semiconductor is formed where the portion of the dielectric layer that is amorphous is removed without forming the semiconductor layer elsewhere. The non-amorphous remainder of the dielectric layer is removed. A first transistor is formed having a channel that uses the semiconductor layer as a first channel material. A laterally adjacent transistor is formed having a channel that uses the semiconductor base layer as a second channel material that differs from the first channel material. In another form the first current electrode of each of the first transistor and the laterally adjacent transistor is concurrently formed with a first semiconductor material. A second current electrode of each of the first transistor and the laterally adjacent transistor is formed with a second semiconductor material that is different from the first semiconductor material. In another form the first current electrode of each of the first transistor and the laterally adjacent transistor are concurrently formed by epitaxial growth from the semiconductor base layer while the semiconductor base layer underlying a region for positioning the second current electrode is blocked by a first non-amorphous dielectric. The second current electrode of each of the first transistor and the laterally adjacent transistor is concurrently formed by epitaxial growth from the semiconductor base layer while the first current electrode of the first transistor and the laterally adjacent transistor is blocked by a second non-amorphous dielectric. In one form hafnium oxide is used as the dielectric layer. In one form an angled heavy ion implant is used to amorphize the portion of the dielectric layer. A shadow region is created by using a height of a control electrode of the first transistor, the shadow region defining the non-amorphous remainder of the dielectric layer. In another form the height of the control electrode is temporarily extended by forming an insulator material on the control electrode, the control electrode having an extended height during the angled heavy ion implant. When used, the insulator material is removed from the control electrode prior to completion of the first transistor. An angle of the angled heavy ion implant is adjusted to a predetermined value to form the shadow region having a predetermined minimum area. In one form the dielectric layer is a metal oxide. In another form the dielectric layer is polycrystallized through a thermal process prior to amorphizing the portion of the dielectric layer.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A semiconductor device, comprising:
   a first transistor comprising:
   a semiconductor substrate;
   control electrode overlying the semiconductor substrate;
   a first current electrode overlying the semiconductor substrate and adjacent a portion of a first side of the control electrode, the first current electrode comprised of a first predetermined semiconductor material;
   a second current electrode overlying the semiconductor substrate and adjacent a portion of a second side of the control electrode, the first current electrode and the second current electrode forming a channel underlying the control electrode, all of the channel comprising a same material and of different material than the semiconductor substrate, the second current electrode having a second predetermined semiconductor material that is different from the first predetermined semiconductor material, the first predetermined semiconductor material being chosen to optimize bandgap energy of the first current electrode, and the second predetermined semiconductor material being chosen to optimize strain of the channel; and
   a second transistor laterally adjacent the first transistor and separated by an isolation material, the second transistor comprising:
   a control electrode overlying the semiconductor substrate;
   a first current electrode overlying the semiconductor substrate and adjacent a portion of a first side of the control electrode; and
   a second current electrode overlying the semiconductor substrate and adjacent a portion of a second side of the control electrode, the first current electrode and the second current electrode forming a channel underlying the control electrode, the channel comprising entirely a same material that is different from the same material of the first transistor.

2. The semiconductor device of claim 1 wherein the first current electrode and second current electrode of the second transistor have a same material composition.

3. The semiconductor device of claim 1 wherein the first predetermined semiconductor material comprises any one of silicon germanium, germanium, silicon, silicon carbide, carbon doped silicon and any in-situ doped form thereof, and the second predetermined semiconductor material comprises any one of silicon germanium, germanium, silicon, silicon carbide, carbon doped silicon and any in-situ doped form thereof.

4. The semiconductor device of claim 1 wherein the channel of the first transistor is completely formed of silicon germanium.

5. The semiconductor device of claim 1 further comprising an offset spacer laterally surrounding the control electrode of each of the first transistor and the second transistor and respectively having a nonplanar surface in contact with the first current electrode and the second current electrode of each of the first transistor and the second transistor.

6. A transistor, comprising:
   a semiconductor substrate;
   a control electrode overlying the semiconductor substrate;
   a first current electrode overlying the semiconductor substrate and adjacent a portion of a first side of the control electrode, the first current electrode comprised of a first predetermined semiconductor material throughout the first current electrode;
   a second current electrode overlying the semiconductor substrate and adjacent a portion of a second side of the control electrode, the first current electrode and the second current electrode forming a channel underlying the control electrode, all of the channel comprising a same material that is of different material than the semiconductor substrate, the second current electrode having a second predetermined semiconductor material throughout the second current electrode that is different from the first predetermined semiconductor material and the same material of the channel, the first predetermined semiconductor material being chosen to optimize bandgap energy of the first current electrode, and the second predetermined semiconductor material being chosen to optimize strain of the channel; and
   a sidewall spacer radially surrounding the control electrode and overlying each of the first current electrode and the second current electrode.

7. The transistor of claim 6 further comprising:
   silicide regions overlying each of the control electrode, the first current electrode and the second current electrode, the silicide regions providing electrical contact to the transistor.

8. The transistor of claim 7 wherein an outer edge of the sidewall spacer positions the silicide regions overlying the first current electrode and the second current electrode.

9. A transistor, comprising:
   a semiconductor substrate;
   a control electrode overlying the semiconductor substrate;
   a drain electrode overlying the semiconductor substrate and adjacent a portion of a first side of the control electrode, the drain electrode comprised entirely of a same high bandgap energy material of one of carbon doped silicon, silicon carbide or silicon;
   a source electrode overlying the semiconductor substrate and adjacent a portion of a second side of the control electrode, the drain electrode and the source electrode forming a channel underlying the control electrode, the source electrode comprised entirely of a same material differing from the drain electrode and which optimizes strain of the channel, all of the channel comprising a same material and being of different material than the semiconductor substrate; and
   a sidewall spacer radially surrounding the control electrode and overlying each of the first current electrode and the second current electrode.

10. The transistor of claim 9 further comprising:
    silicide regions overlying each of the control electrode, the drain electrode and the source electrode, the silicide regions providing electrical contact to the transistor.

* * * * *

UNITED STATES PATENT AND TRADEMARK OFFICE
CERTIFICATE OF CORRECTION

PATENT NO.        : 7,230,264 B2                                  Page 1 of 1
APPLICATION NO.   : 11/247866
DATED             : October 7, 2005
INVENTOR(S)       : Voon-Yew Thean et al.

It is certified that error appears in the above-identified patent and that said Letters Patent is hereby corrected as shown below:

On the title page, after the filing date, insert: item [60]

--Related U.S. Application Data

This application is a Divisional Application of Application Serial 10/924,632 filed on 08/24/2004, now U.S. Patent 6,979,622.--

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,230,264 B2
APPLICATION NO. : 11/247866
DATED                : June 12, 2007
INVENTOR(S)       : Voon-Yew Thean et al.

Page 1 of 1

It is certified that error appears in the above-identified patent and that said Letters Patent is hereby corrected as shown below:

On the title page, after the filing date, insert: item [60]

--Related U.S. Application Data

This application is a Divisional Application of Application Serial 10/924,632 filed on 08/24/2004, now U.S. Patent 6,979,622.--

This certificate supersedes the Certificate of Correction issued February 17, 2009.

Signed and Sealed this

Seventeenth Day of March, 2009

JOHN DOLL
*Acting Director of the United States Patent and Trademark Office*